United States Patent [19]

Valley

[11] Patent Number: 4,743,779
[45] Date of Patent: May 10, 1988

[54] ADJUSTABLE THRESHOLD WINDOW CIRCUIT

[75] Inventor: Richard L. Valley, Nashua, N.H.

[73] Assignee: Unitrode Corporation, Lexington, Mass.

[21] Appl. No.: 29,353

[22] Filed: Mar. 20, 1987

Related U.S. Application Data

[63] Continuation of Ser. No. 613,102, May 23, 1984, abandoned.

[51] Int. Cl.$^4$ .................. H03K 5/153; H03K 5/24; G01R 19/165
[52] U.S. Cl. ............................ 307/356; 307/264; 307/360
[58] Field of Search ........... 307/260, 264, 270, 296 R, 307/360, 356, 362

[56] References Cited

U.S. PATENT DOCUMENTS 4,161,700 7/1979 Fujikata et al. ................ 307/360

Primary Examiner—John Zazworsky
Attorney, Agent, or Firm—Weingarten, Schurgin, Gagnebin & Hayes

[57] ABSTRACT

An adjustable threshold window circuit having low-input bias current and constant percentage threshold hysteresis. The window circuit defines an upper reference voltage and a lower reference voltage, both simultaneously adjusted from a common signal wherein the upper threshold voltage increases as the lower voltage threshold decreases to define a voltage window. The threshold voltages are received by a comparator circuit which receives signals to be compared to the upper and lower voltage references, and provides an overvoltage and undervoltage fault indication when the received signals exceed the respective thresholds. The overvoltage and undervoltage fault signals are received by the window circuit, providing an adjustment of the reference voltages to produce a hysteresis effect. The hysteresis is simultaneously adjusted to be proportional to the voltage window as the reference voltages are adjusted, wherein the hysteresis produced maintains a constant percentage or proportion throughout the range of reference voltages.

10 Claims, 2 Drawing Sheets

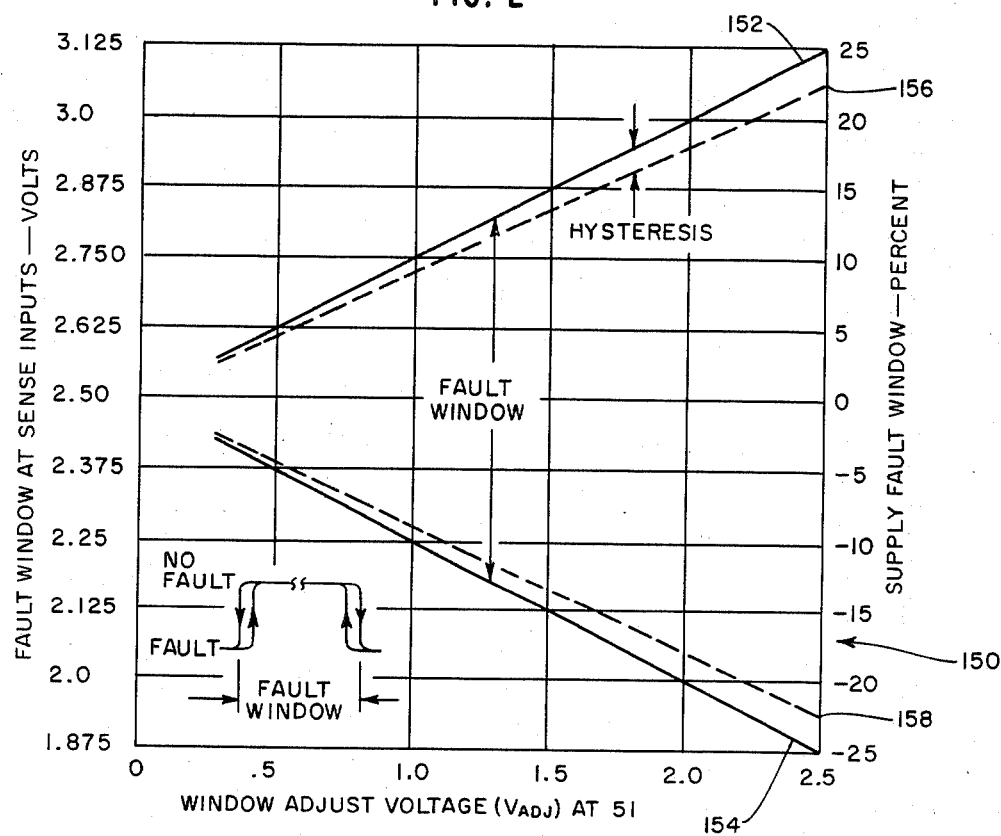

ADJUSTABLE THRESHOLD WINDOW CIRCUIT

This application is a continuation of application Ser. No. 613,102, filed May 23, 1984, now abandoned.

FIELD OF THE INVENTION

The present invention relates to adjustable reference voltage sources, and in particular, adjustable threshold window circuits which provide reference signals to comparator circuits from which an indication of an overvoltage and/or undervoltage condition is derived.

BACKGROUND OF THE INVENTION

Voltages are frequently monitored relative to a predetermined voltage window range, defined by an upper reference signal and a lower reference signal. The reference voltages and the voltages to be monitored are received by comparator circuits, which produce fault indications to logic subsequent elements when one or both limits of the window range is exceeded. When the monitored voltages approach the reference voltages, the fault conditions appear erratically. To provide a more precise fault condition indication as the monitored voltages approach the reference voltage, hysteresis is frequently applied in the comparator circuit. With hysteresis, after the sensed signal exceeds the threshold to produce a fault condition, to restore a nonfault condition, the signal must be reduced by an amount greater than initially required to produce a fault.

The adjustment of the upper and lower reference voltages must frequently be simultaneous about a nominal center voltage, which is typically provided by two separate adjustments. When the circuit includes hysteresis, a change in trigger points is typically a constant voltage difference relative to variations in reference to voltage changes. Consequently, when the reference voltages are adjusted, the relative percentage or proportion of hysteresis changes relative to the reference voltages. However, if it is desirable to maintain a small, constant percentage of the reference voltages as a hysteresis change, the corresponding hysteresis circuit element must also be adjusted. Therefore, if both the upper and lower comparator circuits incorporate hysteresis, any change in reference window voltages would necessitate adjustment of both the upper and lower reference voltages and the upper and lower hysteresis adjustment. This condition presents a cumbersome problem for manufacturing and an opportunity for failure due to an excessive number of adjustable components and their misadjustment.

SUMMARY OF THE INVENTION

The window circuit according to the present invention provides for the simultaneous adjustment of upper and lower reference voltages and maintains a constant percentage hysteresis change in effective reference voltage by a single adjustable voltage. The reference voltages produced are received by a voltage comparator circuit which also receives the signals to be sensed within the defined voltage window and produces an overvoltage and undervoltage fault condition in response thereto.

The window circuit according to the present invention incorporates symmetric current sources and current sinks which accurately define voltages through the use of current mirror circuits in a novel circuit topology. The topology according to the present invention further provides the window adjust signal input with a high impedance characteristic through the use of balanced current sources and current sinks which are responsive to the received threshold adjust signal. The resulting comparator and window circuit combination provides accurate signal sensing and can be easily fabricated on a common semiconductor substrate, forming a unitary power supply and line monitor integrated circuit.

BRIEF DESCRIPTION OF THE DRAWING

These and other features of the present invention will be better understood by reading the following detailed description, taken together with the drawing wherein:

FIG. 2 is a plot of window voltage showing a typical range of positive and negative reference levels, and respective hysteresis values.

DETAILED DESCRIPTION OF THE INVENTION

Figure 1:
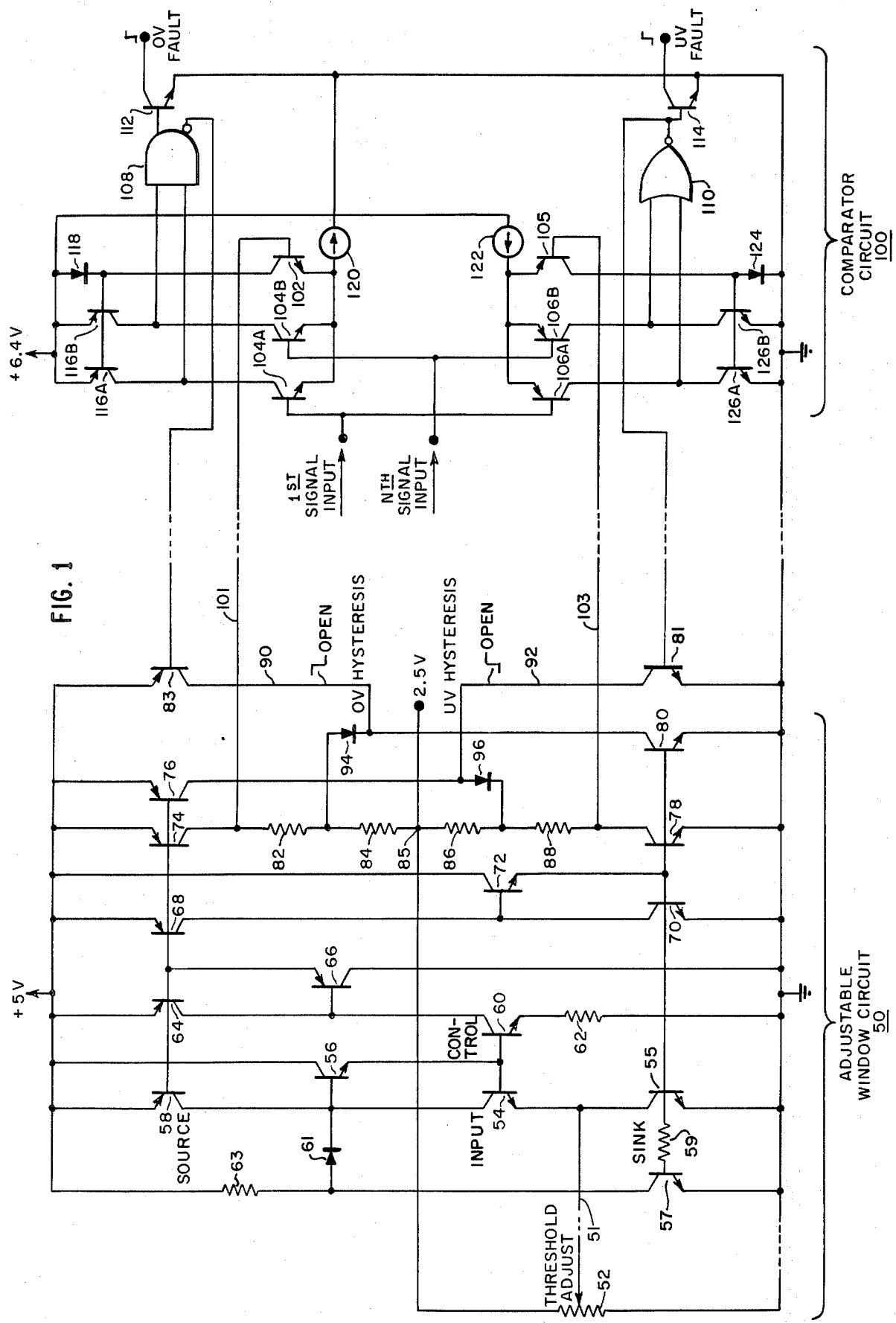
FIG. 1 is a schematic diagram showing the adjustable window circuit according to the present invention in combination with a corresponding comparator circuit.

An adjustable window circuit 50 is shown in FIG. 1 which receives a threshold adjust voltage from a variable voltage divider, typically a adjustable resistance 52 connected across a reference voltage, wherein the adjustable voltage is received at the emitter of an input transistor 54 which is also connected to an adjustable current sink 55. An increase in the receiver threshold adjust voltage at lead 51, received at transistor 54 emitter, causes transistor 54, in combination with transistor 56 and current source transistor 58, to produce a corresponding increase in the base voltage of transistor 54 and the emitter of transistor 56 as well as the base of current control transistor 60, which operates as an emitter-follower. As a result, the voltage at the emitter of transistor 60 corresponds directly to the voltage of the threshold adjust signal, and produces a current defined by resistor 62. The current flow determined by the threshold adjust voltage and resistor 62 flows through the transistor 60 collector and is received by transistors 64 and 66. The voltage at the base of transistor 64 and emitter of transistor 66 varies according to the current flow through the transistor 60. The base of transistor 64 is connected in common with the base of transistor 58, and other transistors discussed below, wherein the transistor 58 has an increased current flow also corresponding to the current produced by transistor 60.

The voltage at the base of transistor 64 is received at the base of transistor 68 to form a current mirror topology wherein the flow of current through the collector of transistor 68 is equal to the flow of current from transistor 64. The current flow from transistor 68 is received by transistors 70 and 72 to produce a change of voltage at the base of transistor 70 as well as at transistor 55, which corresponds directly and oppositely to the change of current flow through transistors 60 and 64. The increase in base voltage of transistor 55 causes an increase in current flow through transistor 55 and the emitter of transistor 54, which equals the current provided by current source transistor 58 at input transistor 54. As a result of the matching of collector and emitter currents of transistor 54 and matching of the corresponding changes produced by changes of the threshold signal at 51, current flow from or to the threshold adjust signal source (52) is substantially eliminated, forming a high impedance signal input at 51.

The variable voltage at the base of transistor 64 is received by transistors 74 and 76 which form current sources and the variable voltage at the base of transistor 70 is received by transistors 78 and 80. The transistors 74 and 76, and transistors 78 and 80, form pairs of current sources and current sinks wherein the magnitude of current in each pair is simultaneously and equally increased as the voltage at the base of transistor 64 increases, which in turn corresponds directly to the threshold adjustment voltage received by transistor 54. The variable current sources and sinks are connected to a resistor network having segments 82, 84, 86, and 88, wherein the current flow therethrough is converted to two reference voltages. The current source 74 and current sink 78 contribute to the flow through for resistor sections 82-88, wherein the current from the current source 76 and current sink transistor 80 is further added through resistors 88 and 82, respectively.

Under a quiescent or non-fault condition, the overvoltage and undervoltage threshold signals on leads 101 and 103 will be at their maximum respective voltage values relative to the 2.5-volt reference point 85 produced between resistances 84 and 86 shown as curves 152 and 154 in FIG. 2. Upon activation of the comparator 100 logic, the output of gates 108 and 110 indicate a fault condition, the current flows from either current source transistor 76 or current sink transistor 80 (from the resistor network) through diodes 96 or 94, respectively. Under the nonfault condition, the collector of transistor 80 is pulled high by transistor 83, causing the reference voltage 152 produced at the junction of resistor 82 and collector of transistor 74. When an overvoltage fault condition does not exist, the overvoltage hysteresis signal on lead 90 is a logical high. When an overvoltage condition exists the signal on lead 90 changes to a logical low or high impedance state, which allows the current from the collector of current sink transistor 80 to flow through diode 94 and resistor 82, causing the reference voltage (152) on lead 101 to decrease (156) toward the 2.5-volt reference at 85 to provide the desired hysteresis effect.

Similarly, when in a nonfault condition the collector of transistor 76 is pulled low by a transistor 81 on lead 92, allowing the reference voltage to increase to a maximum value (154) relative to the reference voltage at 85. When the undervoltage fault condition exists, transistor 81 is turned off and allows the current from transistor 76 to flow through diode 96 and resistor 88, which adds hysteresis to the circuit operation by causing an upward change in reference voltage (158) produced at 103 relative to the 2.5-volt reference voltage. When neither overvoltage and undervoltage hysteresis control signals are inactive, the diodes 94 and 96 become reverse-biased, and therefore open-circuited, to prevent the hysteresis control signals from affecting the voltage references through the resistor network.

The comparator circuit 100 discussed in pending patent application Ser. No. 562,720 by the present applicant, herein incorporated by reference, comprises a complementary pair of differential amplifier stages, including reference input transistors 102 and 105 which receive the upper voltage reference and lower voltage reference signals, respectively. One or more input signals are received by parallel input transistors, representatively shown as transistors 104A and 104B and transistors 106A and 106B. As described in the above-referenced application, additional parallel input transistors may be implemented in the circuit. The base of transistors 104A and 106A, as well as 104B and 106B, receive the signals to be sensed relative to the upper and lower voltage references. The signals produced on the collectors of transistors 104A and 104B are received by logic gate 108; similarly, the collector of transistors 106A and 106B are received by a logic gate 110 to logically combine their output. The logic gates 108 and 110 produce logical and complementary signals when one or more input signals exceed the respective upper or lower reference values. The logical and complementary output signals of gates 108 and 110 drive subsequent circuit transistors 112 and 114, respectively. Similarly, the logic elements 108 and 110 provide the hysteresis control signal at the base of transistor 81 and 83, respectively, as discussed earlier to control the hysteresis effect on the reference voltage level.

The transistors 104A and 104B receive a flow of current determined by transistors 116A and 116B as determined from a flow of current through diode 118 corresponding to the current of transistor 102. Moreover, the total current flow through transistors 104A, 104B, and 102 is limited to the current determined by current sink 120. Similarly, the current source 122 provides a total flow of current through transistors 106A, 106B, and 105. The transistor 105 provides a current flow through diode 124, which establishes a current flow through transistors 106A and 106B by transistors 126A and 126B, respectively.

The hysteresis control voltages on leads 90 and 92, when active, assume an open or high impedance state, allowing current to flow through transistors 80 and 76 and resistor elements 82 and 88, respectively. This in turn causes the corresponding change in reference voltages as shown in curves 156 and 158 of FIG. 2 to form the hysteresis response 150 as desired. Since both the transistors 74 and 78, as well as transistors 76 and 80, are controlled by the threshold adjust signal, the threshold is symmetrically controlled by the threshold adjust, as well as allowing the hysteresis characteristic to maintain a constant proportion throughout the threshold adjust voltage range.

The present invention is not limited to the above-described embodiment. Additional embodiments, variations, and configuration, which may be made through subsitutions of known parts by one skilled in the art are within the scope of the present invention. Therefore, the present invention is not to be limited except according to the claims which follow.

I claim:

1. An adjustable window circuit responsive to means for providing a control voltage, comprising:
   a voltage comparator having an upper threshold input, a lower threshold input and an input for receiving a signal to be compared;
   an upper reference voltage source providing an upper reference voltage greater than a midvoltage reference signal to said comparator upper threshold input;
   a lower reference voltage source providing a lower reference voltage less than a midvoltage reference signal to said comparator lower threshold input;
   first means for selectively adjusting said upper and lower reference voltages according to said control voltage; and second means for selectively adjusting said upper and lower reference voltages according to said signal to be compared, providing hysteresis, wherein said upper reference voltage and said lower reference voltage are greater and lesser than said midvoltage reference signal, the value of said upper and lower reference voltages has a greater difference with regard to said midvoltage reference signal when said signal to be compared is within said upper and lower reference voltages providing a widened voltage window, the value of said upper and lower reference voltages has a lower difference with regard to said midvoltage reference signal when one of said upper and lower reference voltages is exceeded by said signal to be compared, thus providing a narrowed voltage window, and wherein said second means for selectively adjusting provides a selected amount of hysteresis according to the difference between the upper and lower reference voltages.

2. The adjustable window circuit of claim 1, wherein said upper and lower reference voltage sources include a first current source and first current sink respectively.

3. The adjustable window circuit of claim 2, wherein each said first current source and first current sink includes a first and a second current mirror, respectively.

4. The adjustable window circuit of claim 3, wherein said second means for selectively adjusting receives a selected threshold voltage and produces a corresponding selected current received by one of said first and second current mirrors, which, in turn, controls the other said first and second current mirrors.

5. The adjustable window circuit of claim 4, further comprising a resistance connected between said first current source and said first current sink, wherein an increase in selected threshold voltage produces a corresponding equal increase in current flow through both said first current source and said first current sink, producing a symmetrical increase in the voltage across said resistance, wherein the voltage at the resistance end connected to said first current source increases by a voltage difference, and the voltage at the resistance end connected to said first current sink decreases by said voltage difference, and wherein a decrease in selected threshold voltage produces a corresponding symmetrical decrease in voltage across said resistance.

6. The adjustable window circuit of claim 2, wherein said voltage comparator provides a fault signal when said input signal exceeds at least one of said upper and lower reference voltages.

7. The adjustable window circuit of claim 6, wherein said second means for selectively adjusting includes a second current source and a second current sink, each controlled according to said fault signal.

8. The adjustable window circuit of claim 7 wherein said upper and said lower reference sources comprise a current source and a current sink having a resistance connected therebetween, said upper and lower threshold voltages appearing at the ends of said resistance, respectively, wherein said resistance is divided into a plurality of segments, said second means for selectively adjusting, said second current source and said second current sink are connected to said resistance between said segments causing a change in current flow through at least a part of said resistance to produce a change in at least one reference voltage according to said fault signal.

9. The adjustable window circuit of claim 8, wherein said fault signal comprises an overvoltage signal and an undervoltage signal controlling said first current sink and first current source respectively.

10. The adjustable window circuit of claim 1, wherein said first means for selectively adjusting comprises:
an input transistor receiving a signal input and a source of current at a current input, and providing a flow of output current, the current provided by said source of current and said flow of output current being equal;

a current control transistor connected to said input transistor having an output voltage equal to said signal input; and a current determining resistance connected to said current control transistor and receiving thereacross a voltage equal to said signal input to produce a flow of current through said current control transistor proportional to said signal input, said flow being received by at least one of said upper and lower reference voltage sources, wherein said flow of current produced by said current control transistor causes a corresponding change in current input received by said input transistor to substantially eliminate the current flow to said input transistor from said input signal.

* * * * *